United States Patent
Hardee

(10) Patent No.: US 7,248,522 B2
(45) Date of Patent: Jul. 24, 2007

(54) SENSE AMPLIFIER POWER-GATING TECHNIQUE FOR INTEGRATED CIRCUIT MEMORY DEVICES AND THOSE DEVICES INCORPORATING EMBEDDED DYNAMIC RANDOM ACCESS MEMORY (DRAM)

(75) Inventor: Kim C. Hardee, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 192 days.

(21) Appl. No.: 10/776,103

(22) Filed: Feb. 11, 2004

(65) Prior Publication Data

US 2005/0052931 A1 Mar. 10, 2005

Related U.S. Application Data

(60) Provisional application No. 60/500,126, filed on Sep. 4, 2003.

(51) Int. Cl.
*G11C 7/00* (2006.01)
(52) U.S. Cl. ............... 365/205; 365/207; 365/189.05
(58) Field of Classification Search ............... 365/205, 365/207, 189.05
See application file for complete search history.

(56) References Cited

U.S. PATENT DOCUMENTS

| | | | |
|---|---|---|---|
| 5,541,885 | A | 7/1996 | Takashima |
| 5,814,851 | A | 9/1998 | Suh |
| 6,049,245 | A | 4/2000 | Son et al. |
| 6,072,333 | A | 6/2000 | Tsukagoshi et al. |
| 6,100,563 | A | 8/2000 | Arimoto |
| 6,208,575 | B1 | 3/2001 | Proebsting |
| 6,275,432 | B1 | 8/2001 | Hardee |
| 6,307,408 | B1 | 10/2001 | Shamiou et al. |
| 6,424,585 | B1 * | 7/2002 | Ooishi .................. 365/226 |
| 6,449,182 | B1 | 9/2002 | Ooishi |
| 6,449,204 | B1 * | 9/2002 | Arimoto et al. .......... 365/205 |
| 6,635,934 | B2 | 10/2003 | Hidaka |
| 6,670,939 | B2 | 12/2003 | Yang et al. |
| 6,795,328 | B2 | 9/2004 | Kato et al. |

FOREIGN PATENT DOCUMENTS

| | | |
|---|---|---|
| JP | 2000-293986 | 10/2000 |
| JP | 2002-025267 | 1/2002 |
| JP | 2003-347431 | 5/2003 |

* cited by examiner

OTHER PUBLICATIONS

Min, Kyeong-Sik, Kawaguchi, Hiroshi, Sakurai, Takayasu, ZigZag Super Cut-off CMOS (ZSCCMOS) Block Activation with Self-Adaptive Voltage Level Controller: An Alternative to Clock-Gating Scheme In Leakage Dominant Era, 2003 IEEE International Solid-State Circuits Conference, Feb. 12, 2003, Salon 1-6, pp. 400-401 and 501-502.

*Primary Examiner*—Huan Hoang
(74) *Attorney, Agent, or Firm*—William J. Kubida; Peter J. Meza; Hogan & Hartson LLP

(57) ABSTRACT

A sense amplifier power-gating circuit and method is disclosed which is of particular utility with respect to DRAM devices, or those incorporating embedded DRAM, and having a power-down (or Sleep) mode of operation. In accordance with a particular technique of the present invention, the local sense amplifier driver transistors serve a dual purpose as both driver and power gate transistors thereby obviating the need for large, distinct power-gating devices. This serves to minimize on-chip area requirements while not degrading sensing speed as in conventional approaches.

38 Claims, 4 Drawing Sheets

SENSE AMPLIFIER POWER-GATING TECHNIQUE FOR INTEGRATED CIRCUIT MEMORY DEVICES AND THOSE DEVICES INCORPORATING EMBEDDED DYNAMIC RANDOM ACCESS MEMORY (DRAM)

CROSS REFERENCE TO RELATED PATENT APPLICATIONS

The present invention is related to, and claims priority from, U.S. Provisional Patent Application Ser. No. 60/500,126 filed Sep. 4, 2003 for: "0.6V 205 MHz 19.5 nsec TRC 16 Mb Embedded DRAM" the disclosure of which is herein specifically incorporated in its entirety by this reference. The present invention is further related to the subject matter disclosed in U.S. patent applications Ser. No. 10/776,054 entitled "Column Read Amplifier Power-Gating Technique for Integrated Circuit Memory Devices and Those Devices Incorporating Embedded Dynamic Random Access Memory (DRAM)" and Ser. No. 10/776,101 entitled: "High Speed Power-Gating Technique for Integrated Circuit Devices Incorporating a Sleep Mode of Operation", the disclosures of which are herein specifically incorporated by this reference in its entirety.

BACKGROUND OF THE INVENTION

The present invention relates, in general, to the field of integrated circuit memory devices and those devices incorporating embedded dynamic random access memory (DRAM). More particularly, the present invention relates to a sense amplifier power-gating technique of particular utility with respect to DRAM devices, or those incorporating embedded DRAM, having a power-down (or Sleep) mode of operation.

Many types of DRAM based devices, or integrated circuits including embedded memory arrays, are currently available including extended data out ("EDO"), synchronous DRAM ("SDRAM"), double data rate ("DDR") DRAM and the like. Regardless of configuration, the primary purpose of the DRAM is to store data. Functionally, data may be written to the memory, read from it or periodically refreshed to maintain the integrity of the stored data. In current high density designs, each DRAM memory cell comprises a pass transistor coupled to an associated capacitor that may be charged to store a value representative of either a logic level "1" or "0". Data stored in these memory cells may be read out and written to them through columns of sense amplifiers coupled to complementary bit lines interconnecting rows of these cells.

Certain sense amplifier designs have included cross-coupled complementary metal oxide semiconductor ("CMOS") latches made up of cross coupled inverters comprising series connected P-channel and N-channel transistors. The common connection of the P-channel devices is generally referred to as the latch P-channel ("LP") node while the corresponding common connection of the N-channel devices is denominated the latch N-channel ("LN") node.

Among the possible layouts for columns of such sense amplifiers is to provide a common LP and LN driver device for all of the sense amplifiers. While such an approach may have certain advantages, the LP and LN driver transistors must be very large and the corresponding LP and LN signal lines must be relatively wide. Because of this, relatively slow latching speeds may be experienced resulting in concomitantly slow "read" and "write" speeds. Moreover, data patterns may be encountered which can cause failures such as a logic level "1" in a field of "0s" will tend to latch very late if the number of sense amplifiers in the column is large.

In an attempt to ameliorate certain of these disadvantages, other sense amplifier layouts have incorporated the use of distributed LP and LN drivers in which a relatively smaller pull-up and pull-down transistor is included in each sense amplifier cell instead of much larger devices common to an entire column of sense amplifiers. Through the use of this technique, narrower LPB (latch P-channel bar) and LNB (latch N-channel bar) signal lines may be run to each sense amplifier cell in a column.

Power-gating has also been used in logic circuits to reduce Sleep Mode power. This is achieved by adding transistors in the VCC and VSS supply paths of the distributed LP (pull-up) and LN (pull-down) driver transistors associated with each sense amplifier cell. These power gate transistors are turned "on" during an Active Mode and turned "off" during Sleep Mode to reduce the total static current due to transistor "off" current. Typically, the gate terminals of the power gate transistors are forced to higher than VCC (in the case of P-channel devices) or lower than VSS (in the case of N-channel devices) voltage levels so that their voltage gate-to-source ($V_{GS}$) is negative. This reduces the "off" current of these transistors significantly.

However, since there would typically be a large number of sense amplifiers coupled to these power gate transistors, and all of these sense amplifiers would be switching at about the same time, the current surge through the power gate transistors during a sensing operation ends up being very large. This current surge causes a voltage drop across the power gate transistors which tends to have the same effect as reducing the level of VCC, thereby degrading sensing speed. Furthermore, these sense amplifier power gate transistors must, of necessity, be made extremely large to avoid degrading circuit speed too much, (although such degradation nonetheless occurs to at least some extent) thereby consuming a great deal of on-chip area.

SUMMARY OF THE INVENTION

In accordance with the present invention, a sense amplifier power-gating circuit and method is disclosed which is of particular utility with respect to DRAM devices, or those incorporating embedded DRAM, having a power-down (or Sleep) mode of operation. In accordance with the technique of the present invention, the local sense amplifier driver transistors also serve a dual purpose as power gate transistors. In an Active Mode (during sensing), there transistors are turned "on" (LPB=VSS, LNB=VCC) and turned "off" (LPB=VCC, LNB=VSS) when the sense amplifier array is deactivated (during bit line precharge operations, or Standby Mode). During a Sleep Mode, a negative $V_{GS}$ is applied to these transistors to reduce the current through the sense amplifiers through LPB being driven to a voltage above VCC while LNB is driven to a voltage below VSS (e.g. LPB=VCC+0.3V, LNB=VSS−0.3V). Through implementation of the technique of the present invention, large, distinct power gate transistors are not required, thereby minimizing on-chip area requirements, and sensing speed is not degraded as with conventional approaches.

Particularly disclosed herein is an integrated circuit device including a memory array comprising at least one sense amplifier coupled to complementary bit lines, with the sense amplifier having first and second voltage nodes thereof. A first transistor couples the first voltage node to a first voltage source and a control terminal of the first transistor is coupled to receive a first control signal. A second transistor couples the second voltage node to a second voltage source and a control terminal of the second transistor is coupled to receive a second control signal.

Also disclosed herein is a method for power-gating in an integrated circuit device incorporating a memory having at least one sense amplifier comprising providing first and second transistors for coupling first and second voltage nodes respectively of the sense amplifier to respective first and second voltage sources. The first and second transistors are enabled in an Active Mode of operation to couple the first and second voltage nodes to the first and second voltage sources respectively. The first and second transistors are disabled in a Standby Mode of operation to decouple the first and second voltage nodes from the first and second voltage nodes respectively. The first and second transistors are further disabled in a Sleep Mode of operation by applying a voltage greater than that of the first voltage source to a control terminal of the first transistor and a voltage lesser than that of the second voltage source to a control terminal of the second transistor.

Still further disclosed herein is an integrated circuit device including a memory array comprising at least one CMOS sense amplifier coupled to complementary bit lines and including a latch P-channel (LP) and latch N-channel (LN) nodes thereof. A first transistor is coupled between a supply voltage source and the LP node and has a control terminal thereof coupled to receive an LPB signal. A second transistor is coupled between a reference voltage source and the LN node and has a control terminal thereof coupled to receive an LNB signal. In operation, the LPB and said LNB signals present Active, Standby and Sleep states thereof.

In an alternative embodiment of the present invention, there is disclosed a method for power-gating in an integrated circuit device incorporating a memory having a plurality of sense amplifiers comprising providing first and second transistors for coupling first and second shared voltage nodes respectively of the plurality of sense amplifiers to respective first and second voltage sources, enabling the first and second transistors in an Active Mode of operation to couple the first and second shared voltage nodes to the first and second voltage sources respectively, disabling the first and second transistors in a Standby Mode of operation to decouple the first and second shared voltage nodes from the first and second voltage nodes respectively and further disabling the first and second transistors in a Sleep Mode of operation by applying a voltage greater than that of the first voltage source to a control terminal of the first transistor and a voltage lesser than that of the second voltage source to a control terminal of the second transistor.

Still further provided is an alternative embodiment of the present invention wherein there is disclosed an integrated circuit device including a memory array comprising a plurality of sense amplifiers coupled to respective complementary bit lines and each of said plurality of sense amplifiers including first and second shared nodes thereof. A first transistor is coupled between a supply voltage source and the first shared node and has a control terminal thereof coupled to receive a first signal. A second transistor is coupled between a reference voltage source and the second shared node and has a control terminal thereof coupled to receive a second signal wherein the first and said second signals present Active, Standby and Sleep states thereof.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
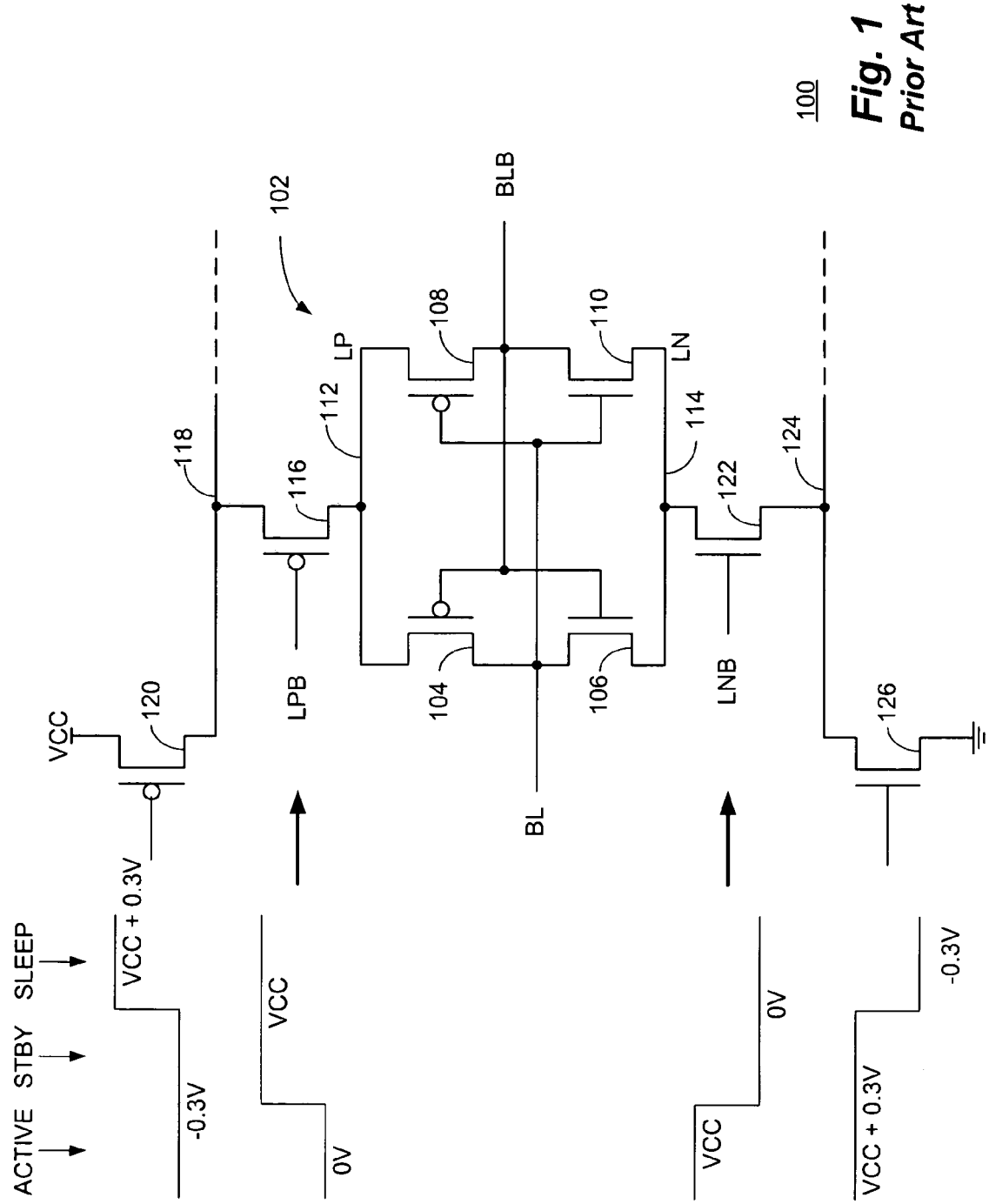
FIG. 1 is a schematic illustration of a conventional sense amplifier circuit for a DRAM array incorporating a conventional power-gating technique having separate pull-up and pull-down driver transistors associated with each sense amplifier in conjunction with separate, large power-gating transistors.

With reference now to FIG. 1, a schematic illustration of a conventional sense amplifier circuit 100 for a DRAM array is shown incorporating a conventional power-gating technique. The conventional sense amplifier circuit 100 comprises, in pertinent part, a sense amplifier 102 in the form of a latch comprising a pair of cross-coupled CMOS inverters.

A P-channel transistor 104 is connected in series with an N-channel transistor 106, with their gate terminals connected together and their drain terminals coupled to a bit line (BL). Another P-channel transistor 108 is connected in series with an N-channel transistor 110 with their gate terminals connected together to the bit line (BL) and their drain terminals connected to a complementary bit line (BLB) and the gate terminals of transistors of transistors 104, 106. The source terminals of transistors 104 and 108 are connected to an LP (latch P-channel) node 112 while the source terminals of transistors 106 and 110 are connected to a corresponding LN (latch N-channel) node 114.

A P-channel, LP driver (pull-up) transistor 116 has its drain terminal connected to the LP node 112 and its source terminal coupled to a common power-gating line 118. The gate terminal of the transistor 116 is coupled to receive an LPB signal as will be described in more detail hereinafter. In like manner, an N-channel, LN driver (pull-down) transistor 122 has its drain terminal connected to the LN node 114 and its source terminal coupled to another common power-gating line 124. The gate terminal of the transistor 122 is coupled to receive an LNB signal as will also be described in more detail hereinafter.

A separate, large power-gating transistor 120 has its drain terminal connected to the common power-gating line 118 and its source terminal connected to a power supply voltage source (VCC). The gate terminal of power-gating transistor 120 is coupled to receive a power-gating voltage control signal as shown. Similarly, another separate, large power-gating transistor 126 has its drain terminal connected to the common power-gating line 124 and its source terminal connected to a reference supply voltage source (VSS, or circuit ground). The gate terminal of power-gating transistor 126 is also coupled to receive a power-gating voltage control signal as shown.

In an Active Mode of operation, a −0.3V signal is applied to the gate terminal of transistor 120 while a 0V (VSS) signal is applied to the LPB input at the gate terminal of transistor 116, turning the latter transistor "on" and overdriving the former transistor "on". Concurrently, a level of VCC is applied to the LNB input at the gate terminal of transistor 122 while a level of VCC+0.3V is applied to the gate terminal of transistor 126. As before, this turns transistor 122 "on" while transistor 126 is overdriven "on" thereby supplying power to the sense amplifier 102.

In a Standby (STBY) mode of operation, the −0.3V signal remains applied to the gate terminal of transistor 120 while a VCC signal level is applied to the LPB input at the gate terminal of transistor 116, leaving the former transistor overdriven "on" and turning the latter transistor "off". At the same time, a level of VSS (0V) is now applied to the LNB input at the gate terminal of transistor 122 turning it "off" while a level of VCC+0.3V is maintained to the gate terminal of transistor 126 leaving it overdriven "on". In this mode of operation, power is not supplied to the sense amplifier 102, but transistors 120 and 126 remain overdriven "on".

Finally, in a Sleep Mode of operation, a VCC+0.3V signal is now applied to the gate terminal of transistor 120 while the VCC signal level remains applied to the LPB input. This turns transistor 116 "off" and overdrives transistor 120 "off". At the same time, a level of VSS (0V) remains applied to the LNB input leaving transistor 122 "off" while a level of −0.3V is now applied to the gate terminal of transistor 126 overdriving it "off". In this mode of operation, power is not supplied to the sense amplifier 102, and transistors 120 and 126 are both overdriven "off".

As mentioned previously, it is desirable to power gate the sense amplifiers 102 to reduce Sleep Mode power. In this regard, the power-gating transistors 120 and 126 are added between the sense amplifiers 102 and the supply voltage sources VCC and VSS respectively. These power-gating transistors 120, 126 function as described previously. Since there are typically a large number of sense amplifiers 102 connected to these power-gating transistors 120, 126, and all of these sense amplifiers 102 would be switching at about the same time, the current surge through the power gate transistors 120, 126 during sensing will be very large. This current surge tends to cause a voltage drop across the power gate transistors 120, 126, which has the same effect as reducing the supply voltage VCC, thereby degrading sensing speed. Furthermore, these sense amplifier power gate transistors 120, 126 must necessarily be made extremely large, consuming a significant amount of on-chip area.

Figure 2:
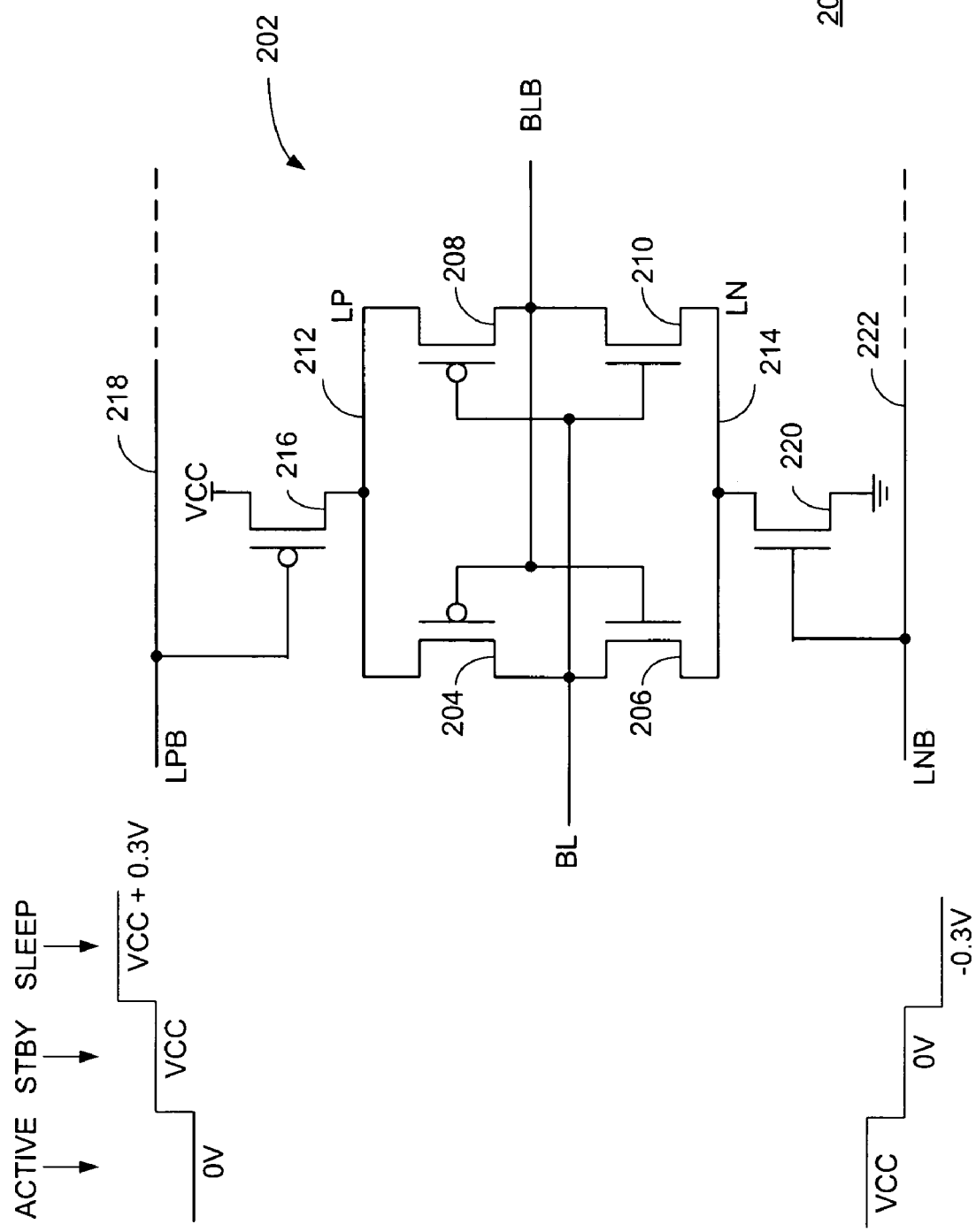
FIG. 2 is a corresponding schematic illustration of a sense amplifier circuit for a DRAM array incorporating a representative power-gating technique in accordance with the present invention utilizing a single, dual purpose driver and power-gating transistor.

With reference additionally now to FIG. 2, a corresponding illustration of a sense amplifier circuit 200 for a DRAM array is shown incorporating a representative power-gating technique in accordance with the present invention. The sense amplifier circuit 200 comprises, as before, a sense amplifier 202 in the form of a latch comprising a pair of cross-coupled CMOS inverters.

A P-channel transistor 204 is connected in series with an N-channel transistor 206, with their gate terminals connected together and their drain terminals coupled to a bit line (BL). Another P-channel transistor 208 is connected in series with an N-channel transistor 210 with their gate terminals connected together to the bit line (BL) and their drain terminals connected to a complementary bit line (BLB) and the gate terminals of transistors of transistors 204, 206. The source terminals of transistors 204 and 208 are connected to an LP node 212 while the source terminals of transistors 206 and 210 are connected to a corresponding LN node 214.

In this instance, a P-channel, LP driver/power-gating transistor 216 has its drain terminal connected to the LP node 212 and its gate terminal coupled to an LPB signal line 218 Its source terminal is coupled to VCC. In like manner, an N-channel, LN driver/power-gating transistor 220 has its drain terminal connected to the LN node 214 and its gate terminal coupled to an LNB signal line 222. It's source terminal is coupled to VSS, or circuit ground.

During an Active Mode of operation, the LPB line 218 is at 0V (VSS) turning transistor 216 "on" while the LNB line 222 is at VCC turning transistor 220 "on", thereby supplying power to the sense amplifier 202. In a Standby Mode of operation, the LPB line 218 is now at VCC turning transistor 216 "off" while the LNB line 222 is now at a level of VSS also turning transistor 220 "off" and decoupling power to the sense amplifier 202. In a Sleep Mode of operation, the LPB line 218 is set at VCC+0.3V overdriving transistor 216 "off" while a level of −0.3V on the LNB line 222 also overdrives transistor 220 "off".

As can be determined, through the use of the technique of the present invention, the local sense amplifier driver transistors 216 and 220 serve a dual function as power-gating transistors. Unlike conventional power-gating approaches, this technique does not also require very large, separate power gate transistors and does not degrade sensing speed.

Figure 3:
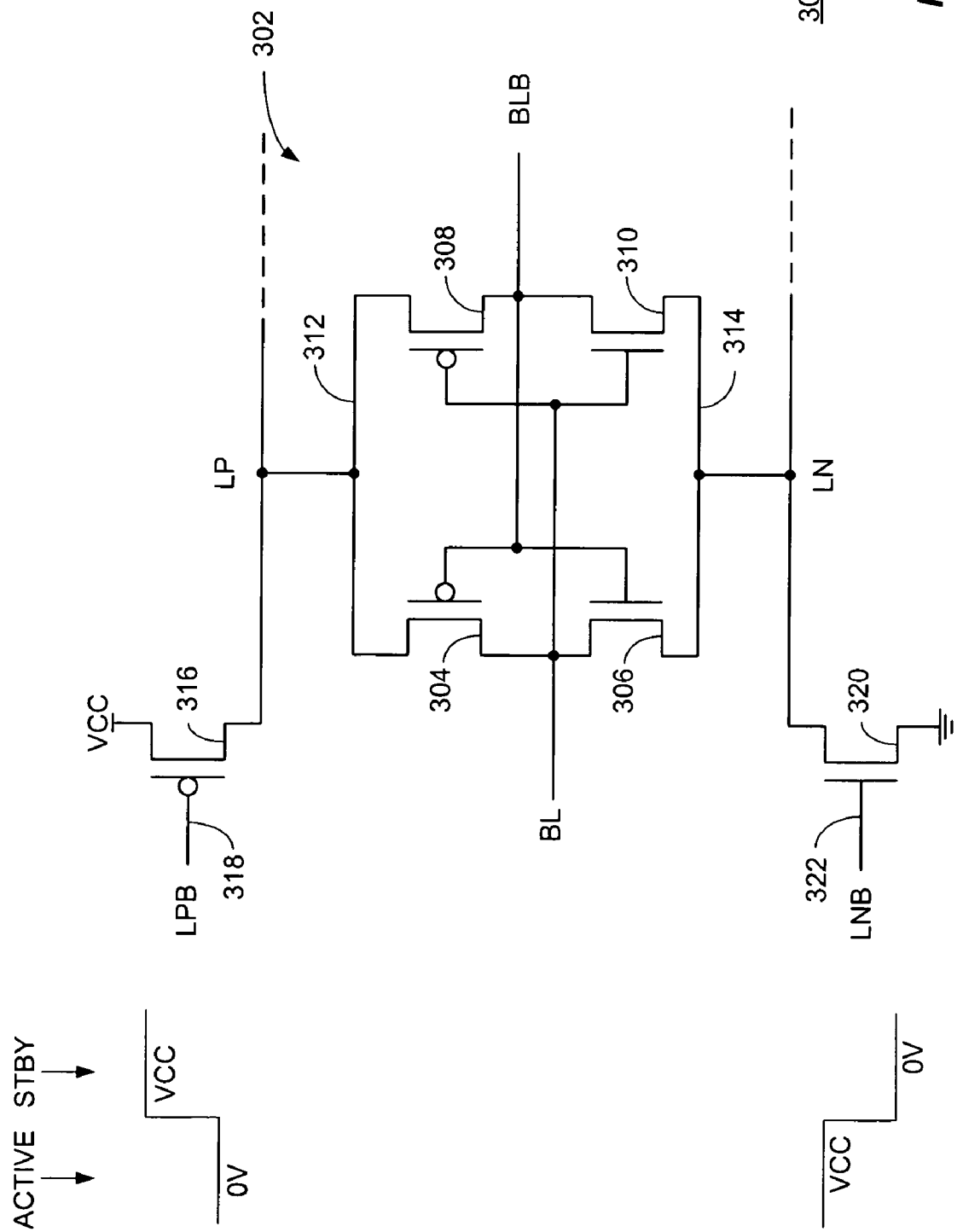
FIG. 3 is a further schematic illustration of an alternative embodiment of a conventional sense amplifier circuit for a DRAM array in which separate load sense amplifier driver transistors are not used and power-gating transistors are shared by a plurality of sense amplifiers in a power-gating technique having only Active and Standby Modes of operation.

With reference additionally now to FIG. 3, a further schematic illustration of an alternative embodiment of a conventional sense amplifier circuit 300 for a DRAM array is shown in which separate sense amplifier power-gating transistors are not used and driver transistors are shared by a plurality of sense amplifiers in a power-gating technique having only Active and Standby Modes of operation. The conventional sense amplifier circuit 300 comprises, in pertinent part, a sense amplifier 302 in the form of a latch comprising a pair of cross-coupled CMOS inverters.

A P-channel transistor 304 is connected in series with an N-channel transistor 306, with their gate terminals connected together and their drain terminals coupled to a bit line (BL). Another P-channel transistor 308 is connected in series with an N-channel transistor 310 with their gate terminals connected together to the bit line (BL) and their drain terminals connected to a complementary bit line (BLB) and the gate terminals of transistors of transistors 304, 306. The source terminals of transistors 304 and 308 are connected to a shared node 312 while the source terminals of transistors 306 and 310 are connected to a corresponding shared node 314. The shared nodes 312 and 314 are common to a plurality of sense amplifiers 302 with as few as two or as many as 1024 or more being coupled in parallel depending on the implementation.

A large P-channel, driver transistor 316 has its drain terminal connected to the shared node 312 and its source terminal coupled to VCC. The gate terminal of the transistor 316 is coupled to receive an LPB signal on line 318. In like manner, a large N-channel, driver transistor 320 has its drain terminal connected to the shared node 314 and its source terminal coupled to VSS. The gate terminal of the transistor 320 is coupled to receive an LNB signal on line 322.

In an Active Mode of operation, a supply voltage (VCC) signal level is applied on line 322 to the gate terminal of transistor 320 while a 0V (VSS) signal is applied on line 318 at the gate terminal of transistor 316, turning both transistors on and enabling the sense amplifiers 302. In a Standby (STBY) mode of operation, the 0V (VSS) signal is applied to the gate terminal of transistor 320 while a VCC signal level is applied to the gate terminal of transistor 316, turning "off" both devices and disabling the sense amplifiers 302.

Figure 4:
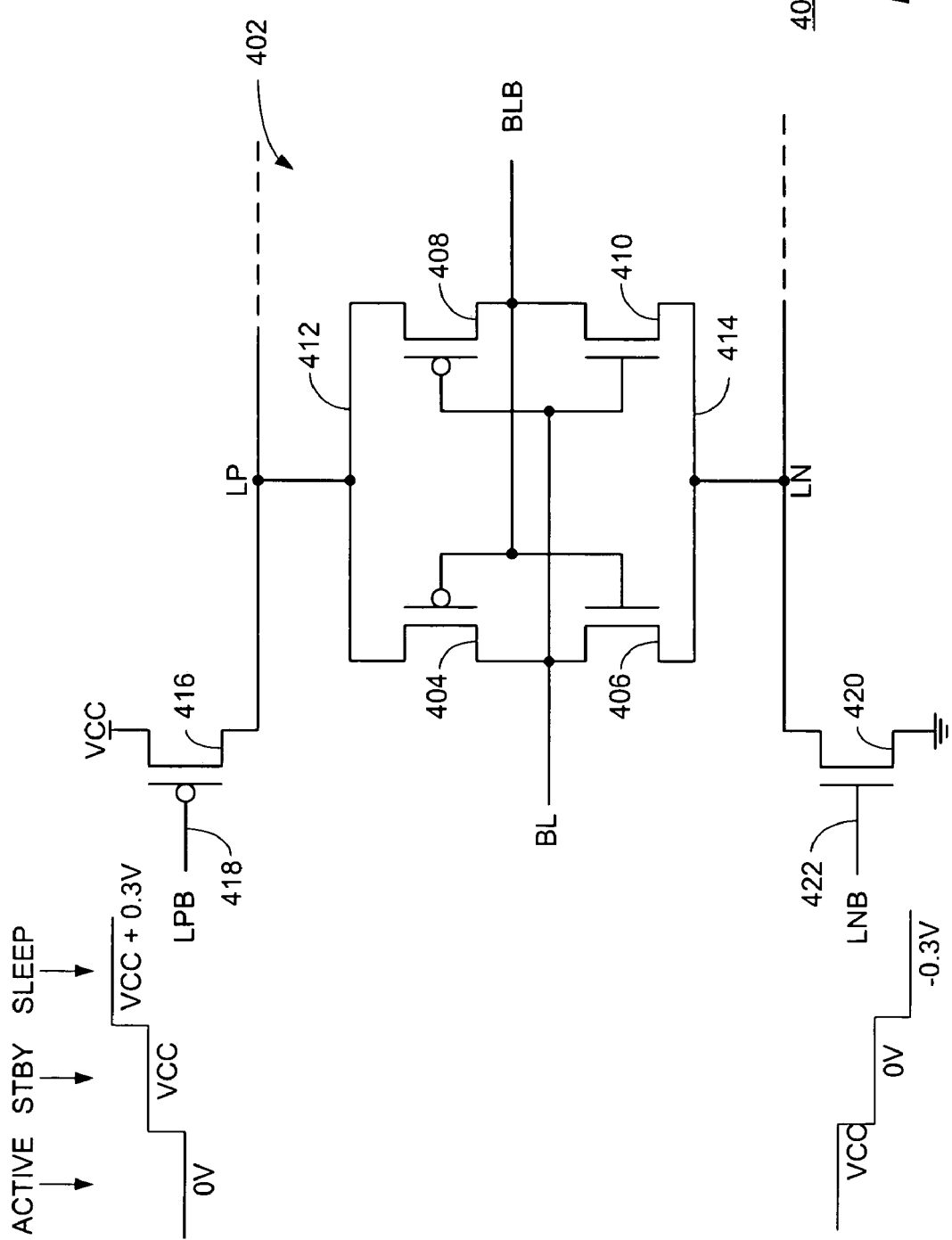
FIG. 4 is a further corresponding schematic illustration of an alternative embodiment of a sense amplifier circuit for a DRAM array incorporating another representative power-gating technique in accordance with the present invention providing Active, Standby as well as Sleep Modes of operation.

With reference additionally now to FIG. 4, a further corresponding schematic illustration of an alternative embodiment of a sense amplifier circuit 400 for a DRAM array is shown incorporating another representative power-gating technique in accordance with the present invention providing Active, Standby as well as Sleep Modes of operation. The sense amplifier circuit 400 comprises, in pertinent part, a sense amplifier 402 in the form of a latch comprising a pair of cross-coupled CMOS inverters.

A P-channel transistor 404 is connected in series with an N-channel transistor 406, with their gate terminals connected together and their drain terminals coupled to a bit line (BL). Another P-channel transistor 408 is connected in series with an N-channel transistor 410 with their gate terminals connected together to the bit line (BL) and their drain terminals connected to a complementary bit line (BLB) and the gate terminals of transistors of transistors 404, 406. The source terminals of transistors 404 and 408 are connected to a shared node 412 while the source terminals of transistors 406 and 410 are connected to a corresponding shared node 414. The shared nodes 412 and 414 are common to a plurality of sense amplifiers 402 with as few as two or as many as 1024 or more being coupled in parallel depending on the implementation.

A P-channel, power-gating and driver transistor 416 has its drain terminal connected to the shared node 412 and its source terminal coupled to VCC. The gate terminal of the transistor 416 is coupled to receive an LPB signal on line 418. In like manner, an N-channel, power-gating and driver transistor 420 has its drain terminal connected to the shared node 414 and its source terminal coupled to VSS. The gate terminal of the transistor 420 is coupled to receive an LNB signal on line 422.

In an Active Mode of operation, a supply voltage (VCC) signal level is applied on line 322 to the gate terminal of transistor 320 while a 0V (VSS) signal is applied on line 318 at the gate terminal of transistor 316, turning both transistors on and enabling the sense amplifiers 302. In a Standby (STBY) Mode of operation, the 0V (VSS) signal is applied to the gate terminal of transistor 320 while a VCC signal level is applied to the gate terminal of transistor 316, turning "off" both devices and disabling the sense amplifiers 302.

The sense amplifier circuit 400 in accordance with the technique of the present invention advantageously further provides a Sleep Mode of operation wherein a signal level of VCC+0.3V is applied on line 418 to the gate terminal of transistor 416 while a corresponding signal level of −0.3V is applied on line 422 to the gate terminal of transistor 420, effectively overdriving both transistors 416 and 420 "off" and reducing current during a Sleep Mode of operation.

While there have been described above the principles of the present invention in conjunction with specific circuit implementations and voltage levels, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

The invention claimed is:

1. An integrated circuit device including a memory array comprising:
   - at least one sense amplifier having Active, Standby and Sleep modes thereof coupled to complementary bit lines, said sense amplifier having first and second voltage nodes thereof;
   - a first transistor coupling said first voltage node to a first voltage source, a control terminal of said first transistor being coupled to receive a first control signal; and
   - a second transistor coupling said second voltage node to a second voltage source, a control terminal of said second transistor being coupled to receive a second control signal,
   - wherein, in a Standby Mode of operation, said first control signal is substantially at a level of said first voltage source and said second control signal is substantially at a level of said second voltage source and
   - wherein, in a Sleep Mode of operation, said first control signal is substantially at a level greater than said first voltage source and said second control signal is substantially at a level lower than said second voltage source.

2. The integrated circuit device of claim 1 wherein said first and second transistors comprise driver/power-gating devices.

3. The integrated circuit device of claim 1 wherein said first and second transistors comprise MOS transistors.

4. The integrated circuit device of claim 3 wherein said first transistor comprises a P-channel device and said second transistor comprises an N-channel device.

5. The integrated circuit device of claim 1 wherein said at least one sense amplifier comprises a latch circuit comprising a pair of cross-coupled inverters.

6. The integrated circuit device of claim 5 wherein said cross-coupled inverters comprise CMOS inverters.

7. The integrated circuit device of claim 1 wherein said first voltage source comprises a supply voltage source and said second voltage source comprises a reference voltage source.

8. The integrated circuit device of claim 7 wherein said supply voltage source comprises VCC and said reference voltage source comprises VSS.

9. The integrated circuit device of claim 1 wherein said first control signal comprises a latch P-channel signal and said second control signal comprises a latch N-channel signal.

10. The integrated circuit device of claim 1 wherein, in an Active Mode of operation, said first control signal is substantially at a level of said second voltage source and said second control signal is substantially at a level of said first voltage source.

11. The integrated circuit device of claim 10 wherein said first control signal is substantially at a reference voltage level and said second control signal is substantially at a supply voltage level.

12. The integrated circuit device of claim 1 wherein, in said Standby Mode of operation, said first control signal is substantially at a supply voltage level and said second control signal is substantially at a reference voltage level.

13. The integrated circuit device of claim 1 wherein, in said Sleep Mode of operation, said first control signal is substantially at a level greater than said supply voltage level and said second control signal is substantially at a level lower than said reference voltage level.

14. An integrated circuit device including a memory array comprising:
at least one CMOS sense amplifier coupled to complementary bit lines and including a latch P-channel (LP) and latch N-channel (LN) nodes thereof;
a first transistor coupled between a supply voltage source and said LP node and having a control terminal thereof coupled to receive an LPB signal;
a second transistor coupled between a reference voltage source and said LN node and having a control terminal thereof coupled to receive an LNB signal wherein said LPB and said LNB signals present Active, Standby and Sleep states thereof wherein,
in a Sleep Mode of operation, said LPB signal is substantially at a level greater than that of said supply voltage source and said LNB signal is substantially at a level lesser than that of said reference voltage source.

15. The integrated circuit device of claim 14 wherein said first transistor comprises a P-channel transistor.

16. The integrated circuit device of claim 14 wherein said second transistor comprises an N-channel transistor.

17. The integrated circuit device of claim 14 wherein, in an Active Mode of operation, said LPB signal is substantially at a level of said reference voltage source and said LNB signal is substantially at a level of said supply voltage source.

18. The integrated circuit device of claim 14 wherein, in a Standby Mode of operation, said LPB signal is substantially at a level of said supply voltage source and said LNB signal is substantially at a level of said reference voltage source.

19. A method for power-gating in an integrated circuit device incorporating a memory having a plurality of sense amplifiers comprising:
providing first and second transistors for coupling first and second shared voltage nodes respectively of said plurality of sense amplifiers to respective first and second voltage sources;
enabling said first and second transistors in an Active Mode of operation to couple said first and second shared voltage nodes to said first and second voltage sources respectively;
disabling said first and second transistors in a Standby Mode of operation to decouple said first and second shared voltage nodes from said first and second voltage nodes respectively; and
further disabling said first and second transistors in a Sleep Mode of operation by applying a voltage greater than that of said first voltage source to a control terminal of said first transistor and a voltage lesser than that of said second voltage source to a control terminal of said second transistor.

20. The method of claim 19 wherein said step of enabling said first and second transistors is carried out by applying a voltage substantially equal to a level of said second voltage source to a control terminal of said first transistor and a voltage substantially equal to a level of said first voltage source to a control terminal of said second transistor.

21. The method of claim 20 wherein said step of disabling said first and second transistors is carried out by applying a voltage substantially equal to a level of said first voltage source to a control terminal of said first transistor and a voltage substantially equal to a level of said second voltage source to a control terminal of said second transistor.

22. An integrated circuit device including a memory array comprising:
a plurality of sense amplifiers coupled to respective complementary bit lines, each of said plurality of sense amplifiers including first and second shared nodes thereof;
a first transistor coupled between a supply voltage source and said first shared node and having a control terminal thereof coupled to receive a first signal;
a second transistor coupled between a reference voltage source and said second shared node and having a control terminal thereof coupled to receive a second signal wherein said first and said second signals present Active, Standby and Sleep states thereof wherein, in a Sleep Mode of operation, said first signal is substantially at a level greater than that of said supply voltage source and said second signal is substantially at a level lesser than that of said reference voltage source.

23. The integrated circuit device of claim 22 wherein said first transistor comprises a P-channel transistor.

24. The integrated circuit device of claim 22 wherein said second transistor comprises an N-channel transistor.

25. The integrated circuit device of claim 22 wherein, in an Active Mode of operation, said first signal is substantially at a level of said reference voltage source and said second signal is substantially at a level of said supply voltage source.

26. The integrated circuit device of claim 22 wherein, in a Standby Mode of operation, said first signal is substantially at a level of said supply voltage source and said second signal is substantially at a level of said reference voltage source.

27. An integrated circuit device including a memory array comprising:
at least one CMOS sense amplifier coupled to complementary bit lines and including a latch P-channel (LP) and latch N-channel (LN) nodes thereof;
a first transistor coupled between a supply voltage source and said LP node and having a control terminal thereof coupled to receive an LPB signal;
a second transistor coupled between a reference voltage source and said LN node and having a control terminal thereof coupled to receive an LNB signal wherein said LPB and said LNB signals each present Active, Standby and Sleep states thereof corresponding to three different voltage levels.

28. The integrated circuit device of claim 27 wherein said first transistor comprises a P-channel transistor.

29. The integrated circuit device of claim 27 wherein said second transistor comprises an N-channel transistor.

30. The integrated circuit device of claim 27 wherein, in an Active Mode of operation, said LPB signal is substantially at a level of said reference voltage source and said LNB signal is substantially at a level of said supply voltage source.

31. The integrated circuit device of claim 27 wherein, in a Standby Mode of operation, said LPB signal is substantially at a level of said supply voltage source and said LNB signal is substantially at a level of said reference voltage source.

32. The integrated circuit device of claim 27 wherein, in a Sleep Mode of operation, said LPB signal is substantially at a level greater than that of said supply voltage source and said LNB signal is substantially at a level lesser than that of said reference voltage source.

33. An integrated circuit device including a memory array comprising:
   a plurality of sense amplifiers coupled to respective complementary bit lines, each of said plurality of sense amplifiers including first and second shared nodes thereof;
   a first transistor coupled between a supply voltage source and said first shared node and having a control terminal thereof coupled to receive a first signal;
   a second transistor coupled between a reference voltage source and said second shared node and having a control terminal thereof coupled to receive a second signal wherein said first and said second signals each present Active, Standby and Sleep states thereof corresponding to three different voltage levels.

34. The integrated circuit device of claim 33 wherein said first transistor comprises a P-channel transistor.

35. The integrated circuit device of claim 33 wherein said second transistor comprises an N-channel transistor.

36. The integrated circuit device of claim 33 wherein, in an Active Mode of operation, said first signal is substantially at a level of said reference voltage source and said second signal is substantially at a level of said supply voltage source.

37. The integrated circuit device of claim 33 wherein, in a Standby Mode of operation, said first signal is substantially at a level of said supply voltage source and said second signal is substantially at a level of said reference voltage source.

38. The integrated circuit device of claim 33 wherein, in a Sleep Mode of operation, said first signal is substantially at a level greater than that of said supply voltage source and said second signal is substantially at a level lesser than that of said reference voltage source.

* * * * *